US009306535B2

(12) United States Patent
Bradley et al.

(10) Patent No.: US 9,306,535 B2
(45) Date of Patent: Apr. 5, 2016

(54) INTEGRATED RECEIVE FILTER INCLUDING MATCHED BALUN

(71) Applicant: Avago Technologies General IP (Singapore) Pte. Ltd., Singapore (SG)

(72) Inventors: Paul Bradley, Los Altos, CA (US); Shen Ye, Cupertino, CA (US); Jeesu Kim, San Ramon, CA (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 151 days.

(21) Appl. No.: 13/780,812

(22) Filed: Feb. 28, 2013

(65) Prior Publication Data

US 2014/0240059 A1    Aug. 28, 2014

(51) Int. Cl.
*H01P 5/10* (2006.01)
*H03H 7/42* (2006.01)
*H03H 7/46* (2006.01)
*H03H 7/38* (2006.01)
*H03H 9/70* (2006.01)
*H03H 9/72* (2006.01)

(52) U.S. Cl.
CPC . *H03H 7/42* (2013.01); *H03H 7/38* (2013.01); *H03H 7/463* (2013.01); *H03H 9/706* (2013.01); *H03H 9/725* (2013.01)

(58) Field of Classification Search
CPC .................................. H03H 7/463; H03H 7/42
USPC .......... 333/275, 25, 133, 189, 193, 4, 26, 187
See application file for complete search history.

(56) References Cited

U.S. PATENT DOCUMENTS

| 7,116,185 B2 | 10/2006 | Ohi et al. |
| 7,755,448 B2 * | 7/2010 | Zolomy et al. ................... 333/32 |
| 7,956,702 B2 | 6/2011 | Lee et al. |
| 2006/0281418 A1 * | 12/2006 | Huang et al. .................... 455/78 |
| 2012/0154071 A1 | 6/2012 | Bradley et al. |
| 2014/0361834 A1 * | 12/2014 | Fritz et al. ..................... 330/275 |

FOREIGN PATENT DOCUMENTS

WO   2012072969 A1   6/2012

OTHER PUBLICATIONS

Emile Davies-Venn et al. "LC-based WiFi and WiMAX Baluns Embedded in a Multilayer Organic Flip-Chip Ball Grid Array (FCBGA) Package Substrate," 2008 IEEE Electronic Components and Technology Conference, pp. 169-174..

* cited by examiner

*Primary Examiner* — Dinh Le

(57) ABSTRACT

A duplexer includes a transmit filter and an integrated receive filter configured to filter a receive signal from an antenna. The integrated receive filter includes a receive filter portion having multiple acoustic resonator filter elements and a matched balun configured to convert a single-ended input signal, received at a single-ended input of the matched balun from a single-ended output of the receive filter portion, to a differential output signal. The matched balun being is located in place of a phase matching inductor of the receive filter portion, eliminating need for the phase matching inductor of the receive filter portion and a phase matching inductor of the matched balun. Impedance at the single-ended input of the matched balun includes a complex conjugate of impedance at the single-ended output of the receive filter portion.

20 Claims, 4 Drawing Sheets

INTEGRATED RECEIVE FILTER INCLUDING MATCHED BALUN

BACKGROUND

Portable communication devices, such as cellular telephones, personal digital assistants (PDAs), electronic gaming devices, laptop computers, and the like, are configured to communicate over wireless networks. Accordingly, each such portable communication device relies on a receiver and a transmitter, typically connected to a single or common antenna, for sending and receiving data and control signals over the wireless network. Of course, the receiver and transmitter may be incorporated into a transceiver, having a receiver portion and a transmitter portion. In order to use the common antenna, a duplexer is included to interface between the antenna and each of the receiver portion and the transmitter portion, so that the receiver portion is able to receive signals on a receive (downlink) frequency, and the transmitter portion is able to send transmit signals on a different transmit (uplink) frequency. The receive and transmit signals may be radio frequency (RF) signals, for example.

Various types of wireless network are implemented according to different communication standards, such as universal mobile telecommunications system (UMTS), global system for mobile communication (GSM), personal communications services (PCS), digital cellular system (DCS), international mobile telecommunication (IMT), and enhanced data rates for GSM evolution (EDGE). The communication standards identify separate bands for transmitting and receiving signals. For example, UMTS band 2 (PCS) provides an uplink frequency band of 1850 MHz-1910 MHz and a downlink frequency band of 1930 MHz-1990 MHz; UMTS band 3 (DCS) provides an uplink frequency band of 1710 MHz-1785 MHz and a downlink frequency band of 1805 MHz-1880 MHz; UMTS band 7 (IMT-E) provides an uplink frequency band of 2500 MHz-2570 MHz and a downlink frequency band of 2620 MHz-2690 MHz; and UMTS band 8 (GMS-900) provides an uplink frequency band of 880 MHz-915 MHz and a downlink frequency band of 925 MHz-960 MHz. Accordingly, a duplexer operating in compliance with a UMTS standard would include a transmit filter having a passband within the corresponding uplink frequency band, and a receive filter having a passband within the corresponding downlink frequency band.

The duplexer includes two band-pass filters having different passbands, thus preventing or reducing interference between the receive and transmit signals. That is, the duplexer includes a receive filter having a receive passband for filtering the receive signals, and a transmit filter having a transmit passband for filtering the transmit signals. The band-pass receive and transmit filters may include acoustic resonator filter elements, such as surface acoustic wave (SAW) resonators or thin film bulk acoustic resonators (FBARs), for example, for filtering the receive and transmit signals. Generally, impedance matching circuits are needed to enable the duplexer to interface with the receiver and transmitter portions of a transceiver, respectively.

One difference between a band-pass filter having SAW resonators (SAW filter) and a band-pass filter having FBARs (FBAR filter) is that the SAW filter may have an inherently differential input or output terminals for differential (balanced) signals, while the FBAR filter has inherently single-ended input and output terminals for single-ended (unbalanced) signals. Therefore, a SAW filter is able to interface directly with the receiver or transmitter portion of the transceiver, which likewise have differential inputs and output terminals. The FBAR filter, however, relies on a balun circuit (in addition to the impedance matching circuit), for example, to convert between single-ended and differential signals in order to interface with the transmitter and receiver portions of the transceiver. This adds to the size, cost and insertion loss of the component.

A matched balun circuit provides impedance matching as well as converts from single-ended input signals to differential output signals. For example, impedance of the single-ended input terminal of the matched balun must match impedance of the single-ended output terminal of the FBAR filter, and the differential impedance of the differential output terminals of the matched balun must equal some matching differential impedance of the differential input terminals of the receiver portion. The balun and impedance matching functionalities are typically provided using inductor-capacitor (LC) circuits, which require a number of inductors and capacitors, an example of which is discussed below with reference to FIG. 2. The fewer inductors and capacitors needed generally result in less space, fewer fabrication steps and lower cost and loss of the matched balun and/or the duplexer overall. Accordingly, design efforts have been made to achieve satisfactory balun and impedance matching functionality with the fewest possible LC elements. However, conventional matched baluns require a minimum of four LC components, as well as a matching circuit (e.g., an inductor) connected min series with the output terminal of the FBAR filter.

SUMMARY

In a representative embodiment, a duplexer includes a transmit filter configured to filter a transmit signal from a transceiver, and an integrated receive filter configured to filter a receive signal from an antenna. The integrated receive filter includes a receive filter portion having multiple acoustic resonator filter elements, and a matched balun configured to convert a single-ended input signal, received at a single-ended input of the matched balun from a single-ended output of the receive filter portion, to a differential output signal. The matched balun is located in place of a phase matching inductor of the receive filter portion, eliminating need for the phase matching inductor of the receive filter portion and a phase matching inductor of the matched balun. Impedance at the single-ended input of the matched balun comprises a complex conjugate of impedance at the single-ended output of the receive filter portion.

In another representative embodiment, a balun, configured in place of a matching inductor at a single-ended output of a receive filter, includes first and second paths. The first path includes a capacitor connected in series between the single-ended output of the receive filter and a first differential output terminal for outputting a first portion of a differential output signal. The second path includes an inductor, connected in series between the single-ended output of the receive filter and a second differential output terminal for outputting a second portion of a differential output signal, and a second capacitor connected between the second differential output terminal and ground. An impedance at an input of the balun matches an impedance at the single-ended output of the receive filter without a phase matching inductor in either the balun or the receive filter.

In another representative embodiment, a balun, configured in place of a matching inductor at a single-ended output of a receive filter, includes first and second paths. The first path includes a capacitor connected in series between the single-ended output of the receive filter and a first differential output terminal for outputting a first portion of a differential output signal. The second path includes a first inductor and a second inductor, connected in series between the single-ended output of the receive filter and a second differential output terminal for outputting a second portion of a differential output signal, and a second capacitor, connected between the first and second inductors and ground. An impedance at an input of the balun matches an impedance at the single-ended output of the receive filter without a phase matching inductor in either the balun or the receive filter.

BRIEF DESCRIPTION OF THE DRAWINGS

The example embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DETAILED DESCRIPTION

Figure 1:
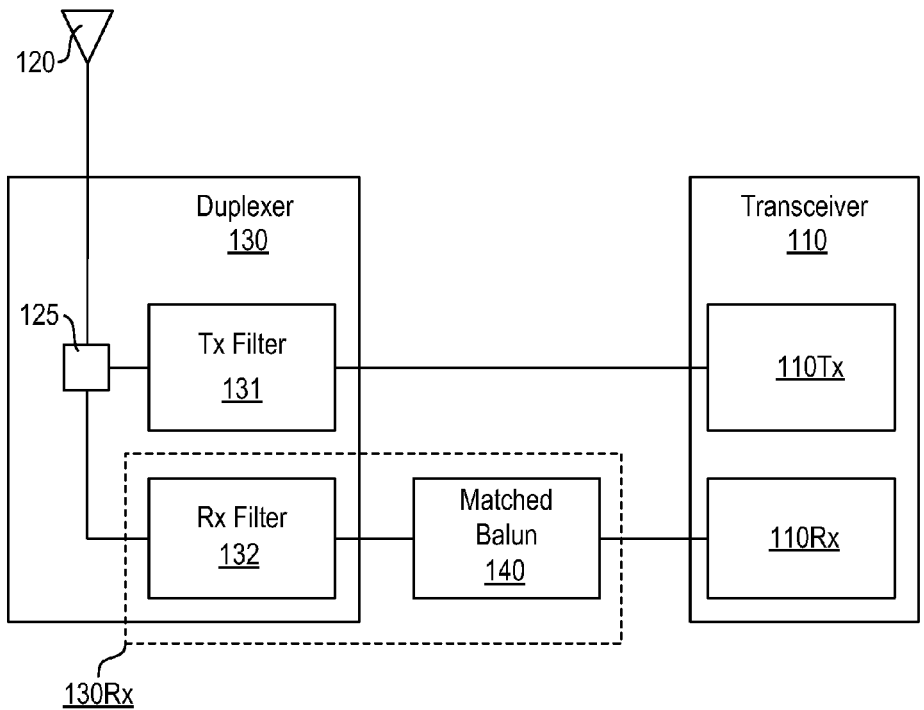
FIG. 1 is a block diagram of a conventional transceiver circuit, including a duplexer.

In the following detailed description, for purposes of explanation and not limitation, representative embodiments disclosing specific details are set forth in order to provide a thorough understanding of the present teachings. However, it will be apparent to one having ordinary skill in the art having had the benefit of the present disclosure that other embodiments according to the present teachings that depart from the specific details disclosed herein remain within the scope of the appended claims. Moreover, descriptions of well-known apparatuses and methods may be omitted so as to not obscure the description of the representative embodiments. Such methods and apparatuses are clearly within the scope of the present teachings.

It is understood that the drawings and the various elements depicted therein are not drawn to scale. Further, relative terms, such as "above," "below," "top," "bottom," "upper" and "lower" are used to describe the various elements' relationships to one another, as illustrated in the accompanying drawings. It is understood that these relative terms are intended to encompass different orientations of the device and/or elements in addition to the orientation depicted in the drawings. For example, if the device were inverted with respect to the view in the drawings, an element described as "above" another element, for example, would now be below that element.

Generally, according to various embodiments of a matched balun, one portion of a differential output signal is generated by a first path that uses a series capacitor to provide amplitude balance between portions of the differential output signal at differential output terminals. The other portion of the differential output signal is generated by a second path (e.g., delay path or lumped element equivalent transmission line) that uses one series inductor followed by one shunt capacitor to generate a large phase delay of the other portion of the differential output signal. Alternatively, the second path may use two series inductors (splitting the inductance of the one series inductor) and one shunt capacitor connected between the two series inductors. The differential mode is well impedance matched to a pair of differential output terminals, while also being well matched on the input side, where the matched balun effectively replaces a matching circuit (e.g., series inductor) at a single-ended output of a receive filter in a duplexer.

FIG. 1 is a block diagram of a conventional transceiver circuit, including a duplexer. Referring to FIG. 1, transceiver circuit 100 includes transceiver 110 connected to common antenna 120 through duplexer 130. The transceiver 110 includes transmitter portion 110Tx for sending transmit signals to the antenna 120 and receiver portion 110Rx for receiving receive signals from the antenna 120. The transmitter portion 110Tx is connected to a transmit filter 131 in the duplexer 130, and the receiver portion 110Rx is connected to a receive filter 132 in the duplexer 130, where the transmit and receive filters 131 and 132 may be FBAR filters, for example. The transmit filter 131 and the receive filter 132 are connected to the common antenna 120 via an antenna matching network 125 to ensure that the transmit filter 131 and the receive filter 132 do not act as mismatching networks between the common antenna 120 and the other filter. The antenna matching network 125 may be a shunt inductor to ground or a quarterwave line going from the transmit filter 131 to the receive filter 132, for example, although other implementations may be included. As discussed above, because the receiver portion 110Rx requires a differential input signal, the single-ended output signal provided by the receive filter 132 passes through matched balun 140, which converts the single-ended input signal into a differential output signal, and which provides impedance matching with respect to the single-ended output terminal of the receive filter 132 and the differential input terminals of the receiver portion 110Rx.

Figure 2:
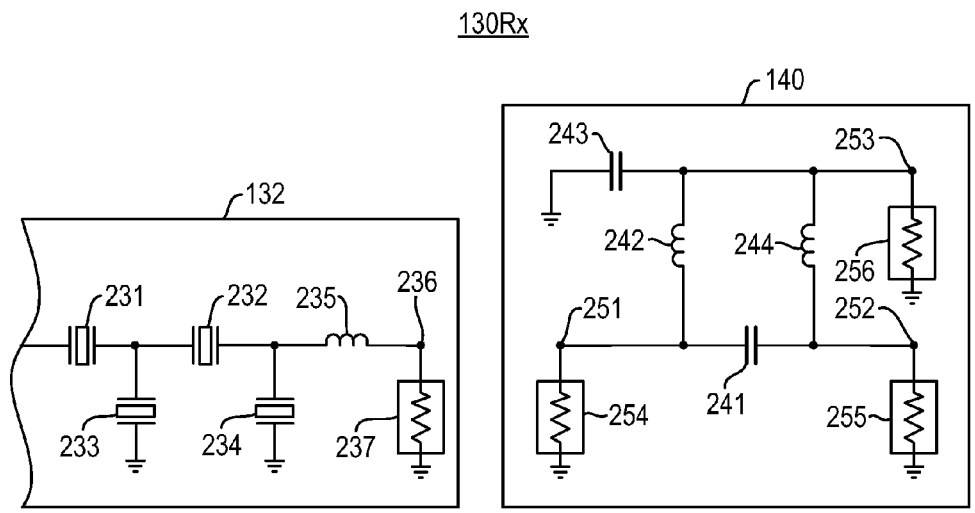
FIG. 2 is a simplified circuit diagram of a portion of the conventional transceiver circuit of FIG. 1.

FIG. 2 is a simplified circuit diagram of a receive portion of the conventional transceiver circuit of FIG. 1. More particularly, FIG. 2 depicts receive branch 130Rx of the transceiver circuit 100, which includes the receive filter 132 and the matched balun 140.

The receive filter 132 includes multiple FBARs, indicated for purposes of illustration as a ladder type filter including representative series FBARs 231 and 232 and representative shunt FBARs 233 and 234 (although other numbers and combinations of series and/or shunt FBARs may be included in the receive filter 132). The receive filter 132 further includes matching inductor 235 connected in series between the last FBAR (FBAR 234) of the receive filter 132 and single-ended output terminal 236. The impedance of the output terminal 236 (e.g., 50 ohms) is indicated by resistor 237. Notably, indication of the resistor 237 would not be present when the receive filter 132 and the matched balun 140 (shown separated for purposes of explanation) are connected to one another, as would be apparent to one of ordinary skill in the art.

The matched balun 140 includes both balun and impedance matching functionality, as discussed above. Examples of conventional matched baluns are provided by Bradley et al. in U.S. Patent Application No. 2012/0154071 (Jun. 21, 2012), which is hereby incorporated by reference. The matched balun 140 has a first path including capacitor 241 and a second path including inductor 242 and capacitor 243. The capacitor 241 is connected in series between single-ended input terminal 251 and first differential output terminal 252 of the matched balun 140. The inductor 242 is connected in series between the single-ended input terminal 251 and second differential output terminal 253, and the capacitor 243 is shunted to ground between the inductor 242 and the second differential output terminal 253. A matching inductor 244 is connected across the first and second differential output terminals 252 and 253 to provide matching impedance with the single-ended output terminal 236 of the receive filter 132. The impedance of the input terminal 251 (e.g., 50 ohms) is indicated by resistor 254, and the differential impedance of the first and second differential output terminals 252 and 253 (e.g., 100 ohms) is indicated by resistors 255 and 256. As mentioned above, indication of the resistor 254 would not be present when the receive filter 132 and the matched balun 140 are connected to one another, and indication of the resistors 252 and 253 would not be present when the matched balun 140 is connected to the receiver portion 110Rx.

Notably, the matching inductor 235 in the receive filter 132 and the matching inductor 244 in the matched balun 140 are relatively large, and thus require sufficient space for incorporation into the transceiver circuit 100. The matching inductors 235 and 244 also introduce loss into the transceiver circuit 100. It is therefore desirable to design a matched balun circuit capable of eliminating the need for such matching inductors.

Figure 3:
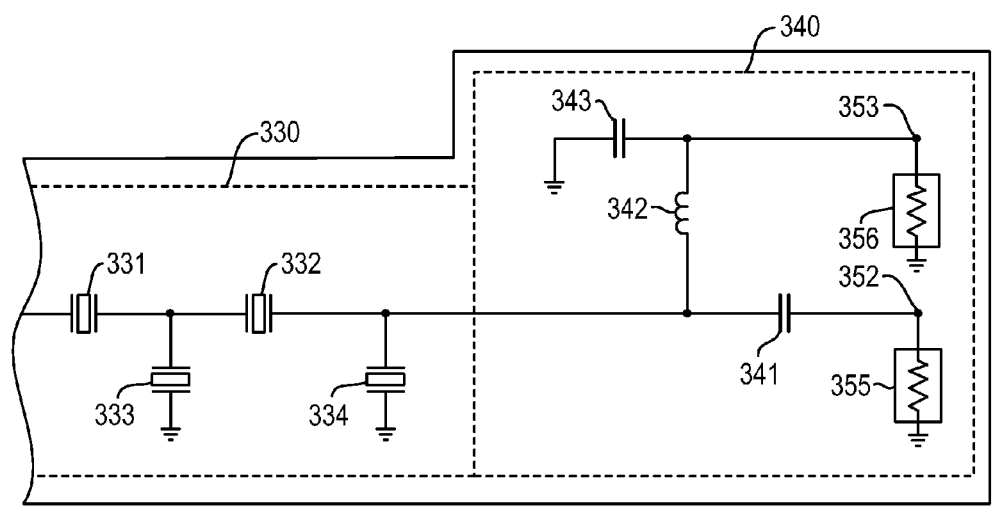
FIG. 3 is a simplified circuit diagram illustrating an integrated receive filter of a transceiver circuit, including a matched balun and receive filter, according to a representative embodiment.

FIG. 3 is a simplified circuit diagram illustrating an integrated receive filter of a transceiver circuit, including a matched balun and receive filter, according to a representative embodiment.

Referring to FIG. 3, integrated filter circuit 310 is configured to replace the receive branch 130Rx of the transceiver circuit 100, depicted in FIGS. 1 and 2. The integrated filter circuit 310 includes receive filter portion 330 and matched balun 340, where the matched balun 340 effectively replaces a matching inductor (e.g., matching inductor 235) connected in series with the last acoustic resonator filter element (FBAR 334) of the receive filter portion 330. The placement and configuration of the matched balun 340 eliminates the need for impedance matching circuits in either the receive filter portion 330 or the matched balun 340.

More particularly, in the depicted embodiment, the receive filter portion 330 includes multiple acoustic resonator filter elements, indicated for purposes of illustration as a ladder type filter including representative series FBARs 331 and 332 and representative shunt FBARs 333 and 334, although other numbers and combinations of acoustic resonator filter elements may be included in the receive filter portion 330 without departing from the scope of the present teachings. The matched balun 340 is connected in series with the last acoustic resonator filter element of the receive filter portion 330, which effectively provides a single-ended output of the receive filter portion 330. In the depicted example, the last acoustic resonator filter element is the shunt FBAR 334. Thus, a single-ended input of the matched balun 340 is connected in series with a first terminal of the shunt FBAR 334 at the location where a matching inductor (e.g., matching inductor 235) would normally be situated in a conventional receive filter (e.g., receive filter 132). A second terminal of the shunt FBAR 334 is connected to ground, either directly or via one or more LC elements.

The matched balun 340 has a first path that provides a first portion of the differential output signal at a first differential output terminal 352 and a second (delayed) path that provides a second portion of the differential output signal a second differential output terminal 353. The first path includes capacitor 341 connected in series between the first terminal of the shunt FBAR 334 and first differential output terminal 352 for fine-tuning impedance and amplitude balance of the first and second differential output terminals 352 and 353. The second path includes inductor 342 and capacitor 343, where the inductor 342 is connected in series between the first terminal of the shunt FBAR 334 and second differential output terminal 353, and the capacitor 343 is shunted to ground between the inductor 342 and the second differential output terminal 353, for producing a delay of approximately 180 degrees for the second differential output terminal 353. A first capacitance value of the capacitor 341 may be approximately half a second capacitance value of the capacitor 343, for example. The differential impedance of the first and second differential output terminals 352 and 353 (e.g., 100 ohms) is indicated by resistors 355 and 356.

Referring to FIGS. 2 and 3 for purposes of comparison, by effectively replacing the matching inductor 235, the design of the matched balun 340 eliminates the matching inductor 235 of the conventional receive filter 132, as well as the matching inductor 244 of the conventional matched balun 240. That is, from the perspective of the matched balun 340 looking into the receive filter portion 330, the balun 340 sees a real and imaginary part of an output impedance (e.g., 50 ohms minus j30 ohms). Meanwhile, from the perspective of the receive filter portion 330 looking into the matched balun 340, the receive filter portion 330 sees the complex conjugate of the real and imaginary part of the output impedance (e.g., 50 ohms plus j30 ohms), which cancels the respective imaginary parts and provides appropriate impedance matching. In other words, the impedance at the single-ended input of the matched balun 340 includes a complex conjugate of the impedance at the single-ended output of the receive filter portion 330, which is not necessarily 50 ohms. Without the matching inductor 244, the matched balun 340 includes only three LC elements (capacitors 341 and 343 and inductor 342) for producing the differential output signal. The elimination of the matching inductors 235 and 244 reduces the physical size and complexity of the duplexer circuit, as well as the cost and insertion loss.

The matched balun 340 may be designed by conceptually adding an imaginary matching inductor, having a negative inductance value, connected in series with the single-ended output of the receive filter portion 330. The negative inductance value is equal in magnitude to a positive inductance value of a matching inductor connected in series with the single-ended output of the receive filter portion 330 (e.g., at the location of conventional matching inductor 235) normally required for matching purposes. The negative and positive inductance values cancel one another, thereby eliminating the need for either of the matching inductor 235, as well as the matching inductor 244, as discussed above, leaving only the three LC elements of the matched balun 340 and improved insertion loss.

In an illustrative implementation, it is assumed that the receive filter portion 330 would require a matching inductor having a value of about 3 nH (e.g., for about a 2 GHz signal), and therefore the imaginary inductor is assigned a value of about −3 nH in order to cancel the matching inductor of the receive filter portion 330. This leaves only the capacitors 341 and 343 and the inductor 342, where the capacitor 341 is determined to have a value of about 1.1 pF, the capacitor 343 is determined to have a value of about 2.3 pF, and the inductor 342 is determined to have a value of about 5.7 nH. Of course, the respective values of the LC components and/or the frequency of the received signal may vary to provide unique benefits for any particular situation or to meet application specific design requirements of various implementations. Generally, the various inductor and capacitor values of the matched balun 340 scale inversely with the frequency of the received signal, while higher impedance levels require the inductors to scale up and the capacitors to scale down proportionately, and lower impedance levels require the inductors to scale down and the capacitors to scale up proportionately.

Accordingly, the matched balun 340 increases total inductance above the inductance of the receive filter (e.g., receive filter portion 330) only by about 3 nH for an approximately 2 GHz received signal (e.g., 2.8 nH inductor 235 is eliminated and 5.7 nH inductor 342 is added for a net change of 2.9 nH.). As mentioned above, this inductance value varies inversely with the frequency of the received signal. In comparison, a conventional matched balun, such as matched balun 140 in FIGS. 1 and 2, increases total inductance above the inductance of the receive filter (e.g., receive filter 132) by about 12 nH for a 2 GHz received signal (and about 24 nH for a 1 GHz received signal). In other words, the matched balun 340 provides four times less additional inductance, and thus four times improvement over the conventional art. Further, the conventional matched balun has greater additional insertion loss, which is about 0.1 dB to about 0.15 dB larger than that of the matched balun 340.

As mentioned above, the decrease in total inductance and elimination of the matching inductors reduces physical size of the duplexer. That is, the physical size of the one inductor 342 is much less than the multiple inductors in the conventional matched balun and receive filter combination. In the case of FBAR filters, the capacitors therefore may be added to the FBAR integrated circuit (IC) die with tight tolerance and small size. The matched balun 340 increases the size of the duplexer by a negligible amount compared to the conventional art and reduces the penalty paid in insertion loss, e.g., from about 0.4 dB to about 0.25 dB. This enables a duplexer that includes the matched balun 340 to be fit into a 2 mm×1.6 mm form factor, which is the next generation of size reduction required for handset duplexers, for example. The conventional four element matched balun, such as the matched balun 140, results in a significantly larger 2 mm by 2.5 mm duplexer which cannot be fit into the smaller form factor. In addition, the total insertion loss penalty is reduced by about 0.15 dB to about 0.2 dB because the matched balun 340 obviates the need for the series matching inductor (e.g., matching inductor 235) in the receive filter usually used for impedance matching in the single-ended duplexer.

Figure 4:
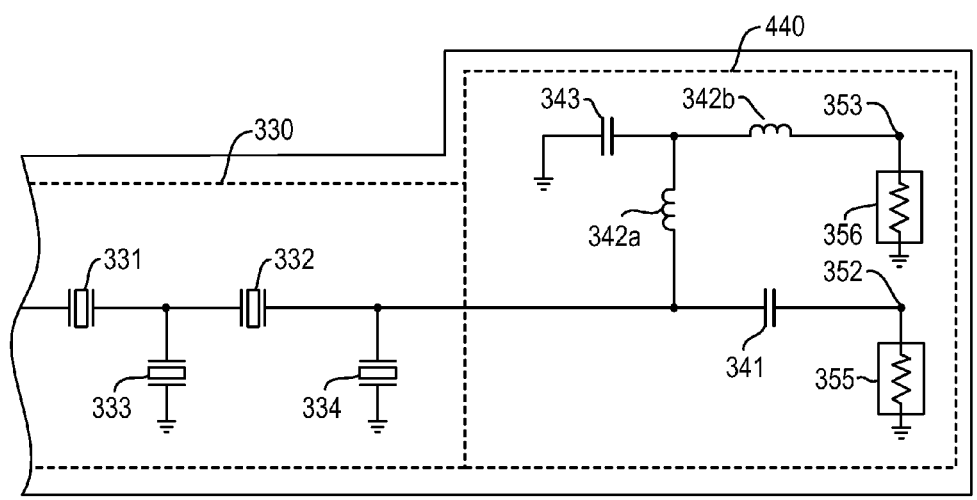
FIG. 4 is a simplified circuit diagram illustrating an integrated receive filter of a transceiver circuit, including a matched balun and receive filter, according to another representative embodiment.

FIG. 4 is a simplified circuit diagram illustrating an integrated receive filter of a transceiver circuit, including a matched balun and receive filter, according to a representative embodiment.

Referring to FIG. 4, integrated filter circuit 410 is configured to replace the receive branch 130Rx of the transceiver circuit 100, depicted in FIGS. 1 and 2. The integrated filter circuit 410 includes receive filter portion 330 and matched balun 440, where the matched balun 440 effectively replaces a matching inductor (e.g., matching inductor 235) connected in series with the last acoustic resonator filter element (FBAR 334) of the receive filter portion 330, thus receiving a single-ended output of the receive filter portion 330. The placement and configuration of the matched balun 440 effectively eliminates the need for matching circuits in either the receive filter portion 330 or the matched balun 340, as discussed above. The receive filter portion 330 is the same as described with reference to FIG. 3, therefore the description will not be repeated.

As in the case of the matched balun 340, the matched balun 440 is connected in series with the last resonator filtering element of the receive filter portion 330 (shunt FBAR 334), which effectively provides a single-ended output of the receive filter portion 330. In other words, a single-ended input of the matched balun 440 is connected in series with a first terminal of the shunt FBAR 334 at the location where a matching inductor (e.g., matching inductor 235) would normally be situated in a conventional receive filter (e.g., receive filter 132). The matched balun 440 has a first path including capacitor 341 and a second (delayed) path including a split inductor, indicated by inductors 342a and 342b, and capacitor 343. The inductors 342a and 342b have the same total inductance value as the inductor 342 in FIG. 3.

In the first path, the capacitor 341 is connected in series between the first terminal of the shunt FBAR 334 and first differential output terminal 352. In the second path, the inductors 342a and 342b are connected in series between the first terminal of the shunt FBAR 334 and second differential output terminal 353, and the capacitor 343 is shunted to ground between the inductors 342a and 342b. As a result, the first and second paths are substantially the same as the first and second paths of the matched balun 440 discussed above with reference to the matched balun 340, except by splitting the inductor 342 into inductors 342a and 342b (with the shunt capacitor 343 connected therebetween), the matched balun 440 may improve phase and amplitude balance without sacrificing other benefits.

Figure 5A:
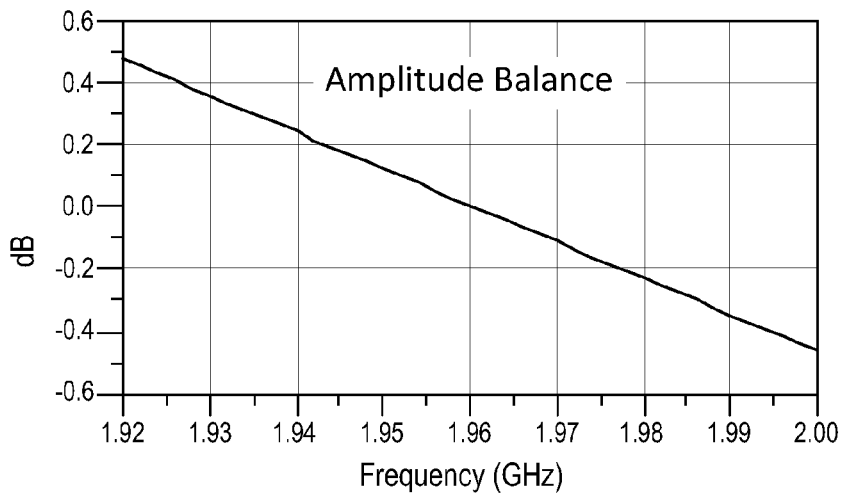
FIGS. 5A to 5C are graphs depicting various simulated performance parameters of the matched balun, according to a representative embodiment.
Figure 5B:
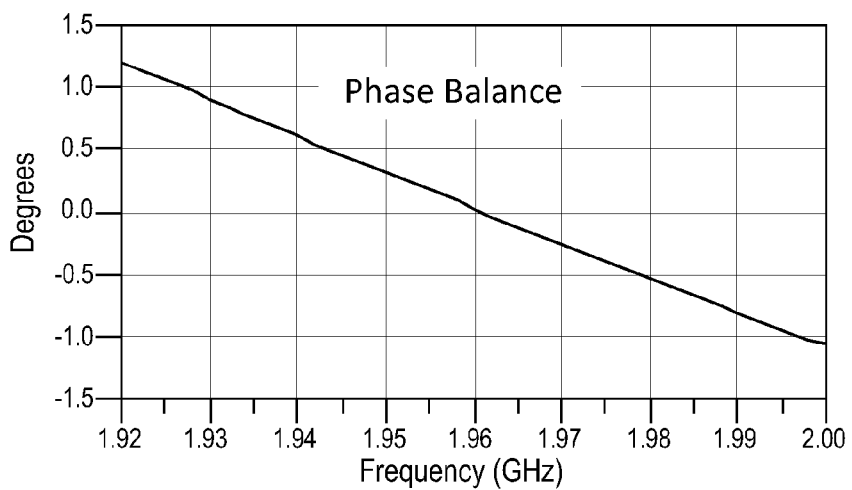
Figure 5C:
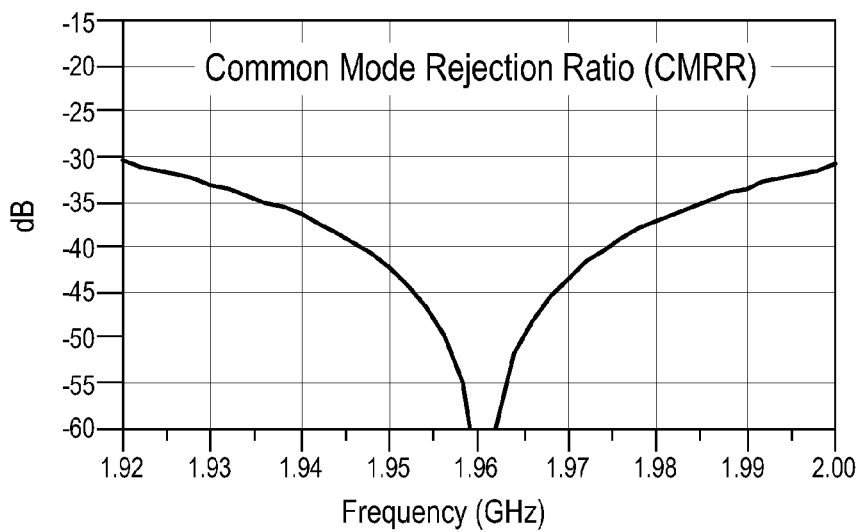

FIGS. 5A to 5C are graphs depicting various simulated performance parameters of the matched balun, according to a representative embodiment. In the simulation, the receive filter portion 330 and the matched balun 340 receive a signal having a 1.96 GHz carrier frequency. The matched balun 340 was configured as described in the above example, where the capacitor 341 had a value of about 1.1 pF, the capacitor 343 had a value of about 2.3 pF, and the inductor 342 had a value of about 5.7 nH.

FIG. 5A depicts amplitude balance between the first and second differential output terminals 352 and 353. The horizontal axis provides frequencies of the received signal in GHz, and the vertical axis provides the differences in amplitude between the signals at first and second differential output terminals 352 and 353 in dB. As shown in FIG. 5A, the amplitude balance becomes zero at the 1.96 GHz carrier frequency, indicating that the differential output signal provided by the matched balun 340 is substantially balanced across the first and second differential output terminals 352 and 353 in amplitude.

FIG. 5B depicts phase balance between the first and second differential output terminals 352 and 353. The horizontal axis provides frequencies of the received signal in GHz, and the vertical axis provides the differences in phase between signals at the first and second differential output terminals 352 and 353 relative to one another. As shown in FIG. 5B, the phase balance also becomes zero at the 1.96 GHz carrier frequency, indicating that the signals forming the differential output signal provided by the matched balun 340 are substantially 180 degrees out of phase.

FIG. 5C depicts the common mode rejection ratio (CMRR) of the first and second differential output terminals 352 and 353. The horizontal axis provides frequencies of the received signal in GHz. The vertical axis provides the ratio of the sum of the amplitudes of the signals at the first and second differential output terminals 352 and 353 and the difference between the amplitudes of the signals at the first and second differential output terminals 352 and 353. As shown in FIG. 5C, the CMRR approaches infinity in an idealized simulation at the 1.96 GHz carrier frequency. The CMRR is another common way to characterize the ideality of the phase and amplitude balance achieved by a balun.

The various components, materials, structures and parameters are included by way of illustration and example only and not in any limiting sense. In view of this disclosure, those skilled in the art can implement the present teachings in determining their own applications and needed components, materials, structures and equipment to implement these applications, while remaining within the scope of the appended claims.

The invention claimed is:

1. A duplexer comprising:
a transmit filter configured to filter a transmit signal from a transceiver; and
an integrated receive filter configured to filter a receive signal from an antenna, the integrated receive filter comprising:
a receive filter portion comprising a plurality of acoustic resonator filter elements to provide a filtered signal at a single-ended output; and
a matched balun coupled to the single-ended output of the receive filter portion and configured to convert the filtered signal at the single-ended output of the receive filter portion to a differential output signal,
wherein the matched balun is further configured to match the single-ended output using an input impedance comprising a complex conjugate of an output impedance of the single-ended output of the receive filter portion, and
wherein the input impedance of the matched balun matches the output impedance of the single-ended output of the receive filter portion without a phase matching inductor in either the matched balun or the receive filter portion.

2. The duplexer of claim 1, wherein the matched balun consists of three LC elements.

3. The duplexer of claim 1, wherein the matched balun comprises:
a first capacitor connected in series between a single-ended input and a first differential output of the matched balun for outputting a first portion of the differential output signal;
an inductor connected in series between the single-ended input and a second differential output of the matched balun for outputting a second portion of the differential output signal; and
a second capacitor connected between the second differential output and ground.

4. The duplexer of claim 1, wherein the matched balun comprises:
a first capacitor connected in series between a single-ended input and a first differential output of the matched balun for outputting a first portion of the differential output signal;
a first inductor connected in series with the single-ended input;
a second inductor connected in series between the first inductor and a second differential output of the matched balun for outputting a second portion of the differential output signal; and
a second capacitor connected between the first and second inductors and ground.

5. The duplexer of claim 3, wherein a first capacitance value of the first capacitor is approximately half a second capacitance value of the second capacitor.

6. The duplexer of claim 1, wherein the receive filter portion comprises a ladder type filter and the plurality of acoustic resonator filter elements comprises series and shunt connected acoustic resonators.

7. The duplexer of claim 6, wherein the acoustic resonator elements comprise film bulk acoustic resonators (FBARs).

8. The duplexer of claim 1, wherein the receive signal comprises a radio frequency (RF) signal.

9. The duplexer of claim 1, wherein an inductance of the matched balun is about 3 nH of a total inductance of the integrated receive filter when the receive signal is has a frequency of approximately 2 GHz for a 50 ohm system.

10. The duplexer of claim 9, wherein the inductance of the matched balun varies inversely with frequency of the received signal.

11. A balun coupled to a single-ended output of a receive filter, the balun being configured to convert a filtered signal from the receive filter to a differential output signal, the balun comprising:
a single-ended input configured to receive the filtered signal provided at the single-ended output of the receive filter;
a first path comprising one first capacitor connected in series between the single-ended input and a first differential output terminal for outputting a first portion of the differential output signal; and
a second path comprising an inductor, connected in series between the single-ended input and a second differential output terminal for outputting a second portion of the differential output signal, and one second capacitor, which is connected between the second differential output terminal and ground,
wherein input impedance of the balun matches output impedance of the single-ended output of the receive filter without a phase matching inductor in either the balun or the receive filter.

12. The balun of claim 11, wherein the first path is configured to provide amplitude balance between the first and second portions of the differential output signal at the first and second differential output terminals.

13. The balun of claim 12, wherein the second path is configured to provide a phase delay so that the first and second portions of the differential output signal are about 180 degrees out of phase.

14. The balun of claim 11, wherein the input impedance of the balun comprises a complex conjugate of the output impedance of the receive filter.

15. The balun of claim 14, wherein differential impedance at the first and second differential output terminals is about 100 ohms.

16. A balun coupled to a single-ended output of a receive filter, the balun being configured to convert a filtered signal from the receive filter to a differential output signal, the balun comprising:
a single-ended input configured to receive the filtered signal provided at the single-ended output of the receive filter;
a first path comprising a first capacitor connected in series between the single-ended input and a first differential output terminal for outputting a first portion of the differential output signal; and
a second path comprising a first inductor and a second inductor, connected in series between the single-ended input and a second differential output terminal for outputting a second portion of the differential output signal, and a second capacitor, connected between the first and second inductors and ground, wherein input impedance of the balun matches output impedance of the signal-ended output of the receive filter without a phase matching inductor in either the balun or the receive filter.

17. The balun of claim 16, wherein the first path is configured to provide amplitude balance between the first and second portions of the differential output signal at the first and second differential output terminals.

18. The balun of claim 17, wherein the second path is configured to provide a phase delay so that the first and second portions of the differential output signal are about 180 degrees out of phase.

19. The balun of claim 16, wherein the impedance at the single-ended input of the balun comprises a complex conjugate of the impedance at the single-ended output of the receive filter.

20. The balun of claim 19, wherein a differential impedance at the first and second differential output terminals is about 100 ohms.

* * * * *